United States Patent
Perzlmaier

(10) Patent No.: US 11,064,590 B2
(45) Date of Patent: Jul. 13, 2021

(54) OPTOELECTRONIC COMPONENT, METHOD FOR MANUFACTURING AN OPTOELECTRONIC COMPONENT AND METHOD FOR OPERATING AN OPTOELECTRONIC COMPONENT

(71) Applicant: OSRAM Opto Semiconductors GmbH, Regensburg (DE)

(72) Inventor: Korbinian Perzlmaier, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 259 days.

(21) Appl. No.: 15/755,013

(22) PCT Filed: Aug. 22, 2016

(86) PCT No.: PCT/EP2016/069811
§ 371 (c)(1),
(2) Date: Feb. 23, 2018

(87) PCT Pub. No.: WO2017/032746
PCT Pub. Date: Mar. 2, 2017

(65) Prior Publication Data
US 2019/0215928 A1 Jul. 11, 2019

(30) Foreign Application Priority Data
Aug. 24, 2015 (DE) .......................... 102015114010.1

(51) Int. Cl.
*H05B 33/08* (2020.01)
*H05B 45/00* (2020.01)
(Continued)

(52) U.S. Cl.
CPC ............. *H05B 45/60* (2020.01); *H01L 27/15* (2013.01); *H05B 45/40* (2020.01); *H05B 45/42* (2020.01);
(Continued)

(58) Field of Classification Search
CPC ............ H05B 33/0896; H05B 33/0809; H05B 33/0848; H05B 33/0857; H05B 33/0887;
(Continued)

(56) References Cited

U.S. PATENT DOCUMENTS 7,009,199 B2 * 3/2006 Hall .................... H01L 25/0753
257/101
7,531,843 B2 * 5/2009 Lin ..................... H01L 25/0753
257/706

(Continued)

FOREIGN PATENT DOCUMENTS

DE 102008024779 A1 11/2009
DE 102015111558 A1 1/2017

*Primary Examiner* — Amy Cohen Johnson
*Assistant Examiner* — Syed M Kaisser
(74) *Attorney, Agent, or Firm* — Slater Matsil, LLP

(57) ABSTRACT

An optoelectronic component, a method for manufacturing an optoelectronic component and a method for operating an optoelectronic component are disclosed. In an embodiment, the component includes a carrier comprising a molded body and a light-emitting semiconductor body with a first segment and a second segment, wherein the first segment and the second segment are spatially separated from one another, and wherein each segment has an emission side facing away from the carrier. The component further includes a first electrical conductor path arranged on the first segment and on the second segment on a side of the light-emitting semiconductor body facing towards the carrier and a first electrical connecting structure and a second electrical connecting structure, each electrically connecting the first segment and the second segment to one another, wherein the (Continued)

first and second electrical connecting structure are electrically connected to one another by the first electrical conductor path.

20 Claims, 3 Drawing Sheets

(51) Int. Cl.
    *H01L 27/15*     (2006.01)
    *H01L 51/52*     (2006.01)
    *H01L 27/32*     (2006.01)
    *H05B 45/40*     (2020.01)
    *H05B 45/42*     (2020.01)

(52) U.S. Cl.
    CPC .......... *H01L 27/3202* (2013.01); *H01L 51/52* (2013.01); *H01L 51/5203* (2013.01); *H01L 2251/564* (2013.01)

(58) Field of Classification Search
    CPC ........ H05B 45/42; H05B 45/60; H05B 45/40; H05B 47/20; H05B 47/21; H01F 27/365; H01F 38/14; H01F 27/15; H01L 27/25; H01L 27/15
    See application file for complete search history.

(56) References Cited

U.S. PATENT DOCUMENTS

| | | | |
|---|---|---|---|
| 7,569,861 B2 * | 8/2009 | Sakai | H01L 27/15 257/88 |
| 7,880,182 B2 * | 2/2011 | Yao | H01L 25/0753 257/88 |
| 8,076,680 B2 * | 12/2011 | Lee | H01L 27/153 257/88 |
| 8,227,999 B2 * | 7/2012 | Van Herpen | B32B 17/10036 315/250 |
| 8,482,663 B2 * | 7/2013 | Farchtchian | H01L 25/0753 348/371 |
| 8,901,857 B2 | 12/2014 | Lachava et al. | |
| 9,391,118 B2 * | 7/2016 | Negley | H01L 27/156 |
| 9,590,008 B2 * | 3/2017 | Moosburger | H01L 33/382 |
| 9,615,420 B2 * | 4/2017 | Miskin | H05B 45/37 |
| 2002/0139987 A1 * | 10/2002 | Collins, III | H01L 27/153 257/88 |
| 2005/0274956 A1 * | 12/2005 | Bhat | H01L 27/15 257/79 |
| 2006/0044864 A1 * | 3/2006 | Lin | H01L 25/0753 365/151 |
| 2006/0163601 A1 * | 7/2006 | Harle | H01L 33/486 257/100 |
| 2007/0273299 A1 * | 11/2007 | Miskin | H05B 45/40 315/250 |
| 2008/0231180 A1 | 9/2008 | Waffenschmidt et al. | |
| 2009/0159677 A1 * | 6/2009 | Yakimov | H05B 45/60 235/439 |
| 2009/0212316 A1 * | 8/2009 | Braune | H01L 33/62 257/99 |
| 2010/0109030 A1 * | 5/2010 | Krames | H01L 33/0079 257/93 |
| 2010/0134790 A1 * | 6/2010 | Vokinger | G01D 5/34715 356/139.03 |
| 2010/0289007 A1 * | 11/2010 | Werner | B82Y 10/00 257/40 |
| 2011/0180818 A1 * | 7/2011 | Lerman | H01L 25/0753 257/88 |
| 2011/0193105 A1 * | 8/2011 | Lerman | F21K 9/20 257/88 |
| 2011/0210675 A1 * | 9/2011 | Hamamoto | F21S 8/031 315/185 R |
| 2012/0153826 A1 | 6/2012 | Waffenschmidt et al. | |
| 2012/0248492 A1 * | 10/2012 | Muller | H01L 31/0224 257/99 |
| 2013/0201636 A1 * | 8/2013 | Van Den Brand | H05K 13/04 361/749 |
| 2014/0049983 A1 * | 2/2014 | Nichol | G02B 6/0018 362/610 |
| 2014/0146535 A1 * | 5/2014 | Hoffmann | F21V 19/004 362/249.02 |
| 2014/0226317 A1 * | 8/2014 | Livesay | H01L 33/641 362/147 |
| 2014/0239809 A1 * | 8/2014 | Miskin | H05B 45/40 315/82 |
| 2014/0264407 A1 | 9/2014 | Tischler et al. | |
| 2014/0301074 A1 * | 10/2014 | Miskin | F21S 8/04 362/235 |
| 2014/0334137 A1 * | 11/2014 | Hasenoehrl | H01L 25/0753 362/147 |
| 2014/0368125 A1 * | 12/2014 | Stack | F21K 9/20 315/251 |
| 2015/0054348 A1 * | 2/2015 | Akiya | H02J 7/025 307/104 |
| 2015/0270719 A1 * | 9/2015 | Kurs | H02J 50/80 320/108 |
| 2015/0380390 A1 * | 12/2015 | Weekamp | H01L 33/58 315/246 |
| 2016/0043571 A1 * | 2/2016 | Kesler | H02J 50/12 307/104 |
| 2016/0081602 A1 * | 3/2016 | Lisogurki | A61B 5/14551 600/476 |
| 2016/0093783 A1 * | 3/2016 | Singer | H01L 33/54 257/98 |
| 2016/0157306 A1 * | 6/2016 | Knoedgen | H05B 45/00 315/210 |
| 2016/0369981 A1 * | 12/2016 | Emde | F21S 6/003 |
| 2017/0108176 A1 * | 4/2017 | Park | H05B 45/00 |
| 2017/0184281 A1 * | 6/2017 | De Samber | F21V 7/0008 |
| 2017/0279019 A1 * | 9/2017 | Ueda | H01L 33/62 |
| 2019/0014631 A1 * | 1/2019 | Van Delden | B63B 59/04 |
| 2019/0215928 A1 * | 7/2019 | Perzlmaier | H01L 27/15 |

* cited by examiner

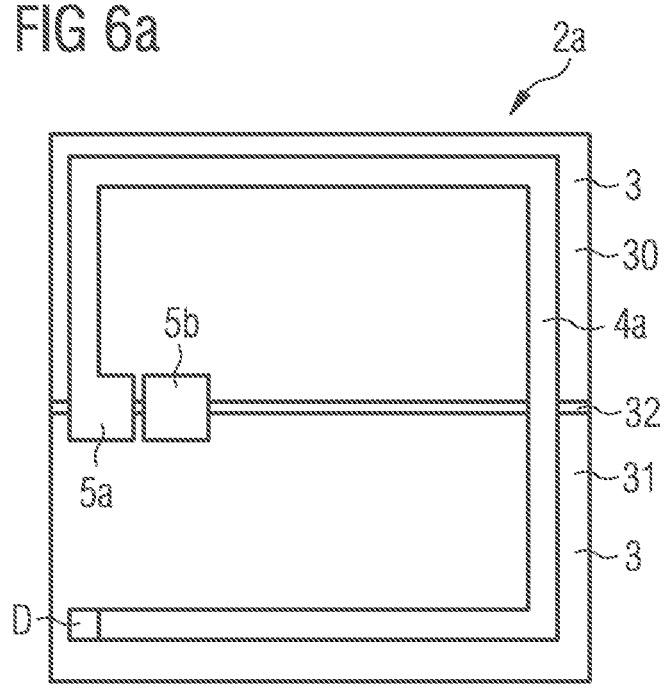
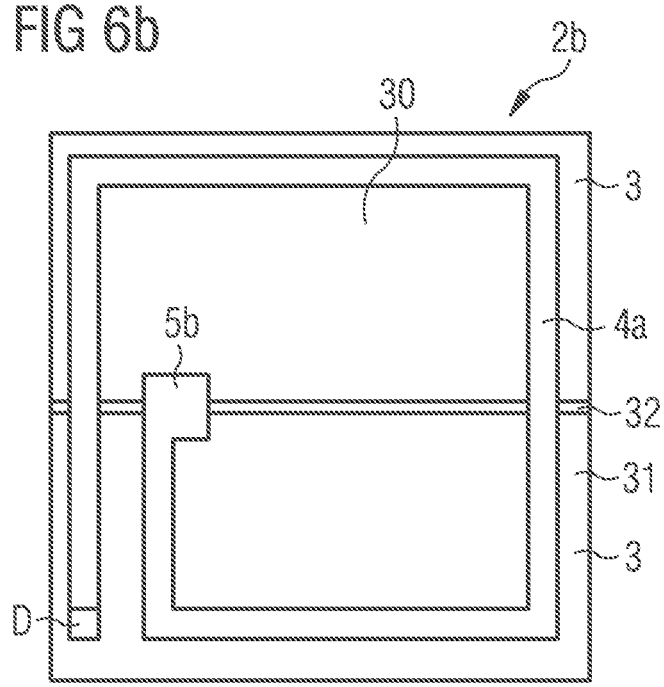

OPTOELECTRONIC COMPONENT, METHOD FOR MANUFACTURING AN OPTOELECTRONIC COMPONENT AND METHOD FOR OPERATING AN OPTOELECTRONIC COMPONENT

This patent application is a national phase filing under section 371 of PCT/EP2016/069811, filed Aug. 22, 2016, which claims the priority of German patent application 10 2015 114 010.1, filed Aug. 24, 2015, each of which is incorporated herein by reference in its entirety.

TECHNICAL FIELD

The invention relates to an optoelectronic component, a method for manufacturing an optoelectronic component and a method for operating an optoelectronic component.

SUMMARY OF THE INVENTION

Embodiments of the invention provide an optoelectronic component having inductive coupling of an operating voltage into the component. Further embodiments of the invention provide a method for manufacturing and for operating an optoelectronic component of this type.

In various embodiments the optoelectronic component comprises a carrier, which comprises a molded body, a light-emitting semiconductor body with a first segment and a second segment, wherein the first segment and the second segment are spatially separated from one another and each have an emission side which faces away from the carrier. The optoelectronic component further comprises an electrical conductor path, which is arranged on the first segment and on the second segment on a side of the light-emitting semiconductor body facing towards the carrier, and a first electrical connecting structure and a second electrical connecting structure, which each electrically connect the first segment and the second segment to one another and are electrically connected to one another by means of the electrical conductor path such that the first segment and the second segment are connected in antiparallel by the first electrical connecting structure and the second electrical connecting structure. The first electrical connecting structure, the second electrical connecting structure and the electrical conductor path are completely covered by the molded body on a side of the light-emitting semiconductor body facing towards the carrier.

In various further embodiments the first segment can advantageously be separated from the second segment by means of a separation trench, which is incorporated into the semiconductor body. The semiconductor body can comprise a semiconductor layer sequence with an active zone. The separation trench can extend all the way through the semiconductor layer sequence into the carrier, for example. Advantageously, the first segment and the second segment can have oblique side faces within the separation trench. Furthermore, the first segment and the second segment are configured such that their emission sides point in the same direction.

In yet further embodiments the first electrical connecting structure and the second electrical connecting structure are arranged on the semiconductor body in such a way that the first segment is electrically connected to the second segment. This is advantageously achieved by the fact that the connecting structures bridge the separation trench on a side facing towards the carrier and are arranged partly on the first and partly on the second segment. The connecting structures are in electrical contact with the semiconductor layers of the semiconductor body in this case. The first connecting structure thus electrically connects the first segment to the second segment and the second connecting structure thus electrically connects the second segment to the first segment. A closed circuit is thus advantageously created by the segments and the connecting structures, wherein the segments are connected to one another in antiparallel. For example, an n-type semiconductor layer of the first segment is connected to a p-type semiconductor layer of the second segment by the first connecting structure and a p-type semiconductor layer of the first segment is connected to an n-type semiconductor layer of the second segment by the second connecting structure. Alternatively, a converse connection of n- and p-type is also possible in each case.

The electrical conductor path may advantageously serve the purpose of inductively coupling in current by means of an external magnetic field, wherein the electrical conductor path generates an electric potential between the first connecting structure and the second connecting structure, which potential, owing to the temporally variable inductively coupled magnetic field, is itself temporally variable.

In order to maintain light emission on the semiconductor body when an alternating current is coupled in by way of the electrical conductor path, the first segment and the second segment are advantageously connected in antiparallel. In other words, depending on the direction of the induced current, one segment acts as a diode in the forward direction and the other segment acts as a diode in the reverse direction. When a phase reversal of the voltage occurs, the circuit acts in the opposite direction. In this way, the optoelectronic component can advantageously be operated with an inductively coupled alternating current.

The connecting structures and the conductor path may be covered by the molded body and not exposed since no external contacting is necessary.

According to at least one embodiment of the optoelectronic component, the first segment and the second segment are identically structured.

Since the segments can be identically structured, it is possible to deposit the segments of the component on a growth substrate advantageously at the same time and to produce them both by the same process step. The segments advantageously comprise a semiconductor layer stack, each having an active zone. The active zone can comprise, e.g., a p-n junction. For example, the active zone can also comprise a quantum well structure. Both segments can therefore advantageously have the same sequence of layers and thus the same electrical, thermal and light-emitting properties. This is advantageous because, during operation, the segments function as two chips with the same emission properties.

According to at least one embodiment of the optoelectronic component, the first segment and the second segment do not overlap in a top view.

Because the first segment and the second segment do not overlap, the second segment advantageously cannot cover, and thus shade, an emission surface of the first segment during light emission by the first segment, and vice versa.

According to at least one embodiment of the optoelectronic component, the electrical conductor path between the first electrical connecting structure and the second electrical connecting structure is configured as a coil with at least one turn.

The electrical conductor path advantageously surrounds an area of the first segment and of the second segment at least partly in the shape of a circular loop. In other words, the electrical conductor path forms a turn of a coil. A turn can advantageously be the shape of a circular loop of the electrical conductor path which encloses at least 360°. Alternatively, however, it is also possible that a turn encloses an angle of less than 360°, e.g., 270°. In the case of inductive coupling to a magnetic field of an external coil, a magnetic flux within the area of the electrical conductor path is thus advantageously enclosed by the electrical conductor path. A temporally varying magnetic flux through the area of the electrical conductor path advantageously leads to an induction of current in the electrical conductor path. Furthermore, it is also possible that the coil advantageously comprises multiple turns, which advantageously run in one plane as a planar and spiral-shaped coil or in multiple planes, wherein the turns in multiple planes can overlap in a top view of the coil.

According to at least one embodiment of the optoelectronic component, a third electrical connecting structure, which electrically connects the first segment and the second segment to one another, is electrically connected to the second connecting structure by means of a further electrical conductor path.

A third electrical connecting structure is advantageously in contact with a semiconductor layer sequence of the component corresponding to the first connecting structure. The third electrical connecting structure in this case is advantageously arranged between the first segment and the second segment such that the connecting structure spans a separation trench between the first segment and the second segment on a side of the semiconductor body facing towards the carrier. In other words, the third connecting structure is arranged partly on the first segment and partly on the second segment. Furthermore, the third connecting structure contacts a semiconductor layer in one of the segments in the same way as the first connecting structure. The semiconductor layers arranged between the semiconductor layer to be contacted and the carrier are advantageously plated through by the connecting structures.

According to at least one embodiment of the optoelectronic component, the further electrical conductor path between the second electrical connecting structure and the third electrical connecting structure is configured as a coil with at least one turn.

The further electrical conductor path between the second connecting structure and the third connecting structure advantageously encloses an area of the first segment and of the second segment at least partly in the shape of a circular loop and forms a turn of a coil. In the case of inductive coupling to a magnetic field of an external coil, a magnetic flux within the area of the further electrical conductor path is thus advantageously enclosed by the further electrical conductor path. A temporally varying magnetic flux through the area of the further electrical conductor path advantageously leads to an induction of current in the further electrical conductor path.

In addition to an electrical conductor path acting as a first coil between the first connecting structure and the second connecting structure, the further electrical conductor path between the second connecting structure and the third connecting structure advantageously acts as a second coil.

According to at least one embodiment of the optoelectronic component, the third electrical connecting structure and the further electrical conductor path between the second electrical connecting structure and the third electrical connecting structure are completely covered by the molded body on a side of the light-emitting semiconductor body facing towards the carrier.

The molded body advantageously covers the electrical connecting structures and the conductor paths as an electrically insulating potting and encapsulates them. In this way, external contacting is not possible by a direct electrical contact of the component. The contacting takes place exclusively by induction. Owing to the complete covering by the potting, the component is advantageously shielded against static electricity from the environment. The component is suitable, e.g., for operating in atmospheres with highly explosive gases or corrosive gases, since no current-carrying elements are exposed on the component.

According to at least one embodiment of the optoelectronic component, the first electrical connecting structure and the second electrical connecting structure as well as the second electrical connecting structure and the third electrical connecting structure connect the first segment and the second segment in antiparallel in each case.

The first segment and the second segment are connected to one another in antiparallel by the first and the second connecting structure and are also connected to one another in antiparallel by the second and the third connecting structure. The first connecting structure and the third connecting structure advantageously always connect the same semiconductor layers to one another in the same way. In an operation of the first segment and the second segment by an AC voltage, depending on the phase of the AC voltage, the first and the second segment emit light alternately since the two segments act as diodes connected in antiparallel.

According to at least one embodiment of the optoelectronic component, the electrical conductor path between the first electrical connecting structure and the second electrical connecting structure is connected in parallel with the first segment and with the second segment.

The electrical conductor path has at least one turn between the first electrical connecting structure and the second electrical connecting structure. With a magnetic field applied externally to the electrical conductor path, a current can be induced in the electrical conductor path between the first electrical connecting structure and the second electrical connecting structure by the flux of the magnetic field within the area of a turn of the conductor path. Thus, the electrical conductor path between the first electrical connecting structure and the second electrical connecting structure acts as a voltage source within the component. The voltage source generates an AC voltage. So that the two segments of the semiconductor body which are connected in antiparallel can be operated with an AC voltage, the segments are advantageously connected in parallel with the electrical conductor path. The electrical conductor path itself is to be understood here as a coil with at least one turn, i.e., as an electrical component. In a circuit of this type, during a positive voltage phase of the AC voltage, for example, the first segment is connected in the forward direction and the second segment in the reverse direction. Consequently, a current flows through the first segment with light being emitted by this first segment. During a negative voltage phase, the second segment is connected in the forward direction and the first segment in the reverse direction in relation to the coil.

According to at least one embodiment of the optoelectronic component, the further electrical conductor path between the second electrical connecting structure and the third electrical connecting structure is connected in parallel with the first segment and with the second segment.

Corresponding to the electrical conductor path between the first electrical connecting structure and the second electrical connecting structure, the further electrical conductor path between the second electrical connecting structure and the third electrical connecting structure acts as a voltage source within the component when a voltage is induced therein by an external magnetic field. The further electrical conductor path between the second electrical connecting structure and the third electrical connecting structure acts as a second coil in the component. The second coil generates an AC voltage. So that the two segments of the semiconductor body connected in antiparallel can be operated with an AC voltage from the second coil, the two segments are advantageously connected in parallel with the second coil. The second coil can advantageously also be connected in parallel with the first coil, whereby the induction of AC voltage in the component is advantageously enhanced.

According to at least one embodiment of the optoelectronic component, the molded body comprises an electrically insulating plastics material.

The molded body advantageously acts as a carrier, which remains in the component after the manufacture thereof and covers the semiconductor body on a side facing away from the emission side. Furthermore, the molded body advantageously covers the electrical conductor paths and the electrical connecting structures and encapsulates them against external influences, such as static electricity or moisture. The molded body can completely cover and/or at least partly embed the electrical conductor paths and the electrical connecting structures as a potting, since the electrical conductor paths and the electrical connecting structures do not have to be exposed since no contacting of the component takes place from the outside. The molded body advantageously comprises epoxy, silicone or a thermoplastic material.

The molded body can alternatively have an addition of carbon in the plastics material and can thus have an electrical resistance of preferably 100 MΩ to 100 GΩ. This results in slight electrical conductivity, whereby static electricity can be dissipated.

According to at least one embodiment of the optoelectronic component, the molded body comprises a first plane and a second plane, the first plane comprising a first turn of the electrical conductor path and the second plane comprising a second turn of the electrical conductor path. The first plane is located, e.g., after the semiconductor body, the second plane running parallel to the first plane and following the first plane on a side thereof facing away from the semiconductor body. The two turns of the electrical conductor path in the first plane and in the second plane can be connected to one another in series, e.g., by a contact via through the first plane and/or second plane of the molded body. Furthermore, a contact can be guided from the second plane to one of the connecting structures by means of a contact via through the first plane.

Alternatively, it is also possible that, instead of two turns of the electrical conductor path, both the electrical conductor path and the further electrical conductor path are each contained in one of the two planes. For example, the first plane comprises the electrical conductor path and the second plane comprises the further electrical conductor path. A contacting of the electrical conductor paths in the first plane and in the second plane to the corresponding electrical connecting structures takes place in this case, e.g., as a via hole through the first or second plane of the molded body. The two electrical conductor paths are electrically isolated from one another by the molded body.

According to at least one embodiment of the optoelectronic component, in a top view the first turn of the electrical conductor path in the first plane at least partly overlaps the second turn of the electrical conductor path in the second plane. The turns can be configured such that they overlap at least partly and preferably overlap completely.

According to at least one embodiment of the optoelectronic component, the light-emitting semiconductor body is designed for operation with an AC voltage.

According to at least one embodiment of the optoelectronic component, a converter material is arranged on the emission side of the first segment and/or of the second segment.

The method for manufacturing an optoelectronic component comprises manufacturing the optoelectronic component in a wafer composite, wherein the electrical conductor path is produced by electroplating on the light-emitting semiconductor body and the carrier is manufactured by means of encapsulating the light-emitting semiconductor body, the electrical connecting structures and the electrical conductor path with the molded body such that the electrical connecting structures and the electrical conductor path are completely covered by the molded body on the side of the light-emitting semiconductor body facing towards the carrier.

The semiconductor body can, for example, be grown epitaxially on a growth substrate as a semiconductor layer sequence and can form a wafer together with the growth substrate. In a further step, a separation trench can be formed in the semiconductor layer sequence, defining a first segment and a second segment of the semiconductor body. After attaching electrical connecting structures and the electrical conductor path, the molded body is advantageously attached as a carrier on a side of the semiconductor body facing away from the growth substrate and the growth substrate is removed. The molded body can form a composite with multiple optoelectronic components, e.g., by encapsulating a plurality of semiconductor bodies. A plurality of components can be manufactured simultaneously in the wafer composite.

The growth substrate can be removed from the semiconductor body, e.g., by a lift-off process. Advantageously, the removal of the growth substrate takes place by means of etching and/or grinding.

The electrical conductor path and the further electrical conductor path can be deposited on the semiconductor body, e.g., by electroplating, e.g., by means of a seed layer. After encapsulating with the molded body, it is advantageously unnecessary to expose the conductor path and the electrical connecting structures and therefore no thinning of the carrier is required.

According to at least one embodiment of the method, a converter material is deposited on the emission side.

The converter material can be incorporated into a matrix material.

According to at least one embodiment of the method, a transparent protective lacquer is deposited on all external surfaces of the optoelectronic component.

The transparent protective lacquer can advantageously be deposited on all sides of the optoelectronic component as an outer layer. As a result, the component can advantageously be better protected against external influences such as static electricity, moisture, explosive gases or corrosive gases. The protective lacquer advantageously acts as an ESD protection, dissipating electrostatic discharges (ESD).

The method for operating an optoelectronic component comprises operating the light-emitting semiconductor body by means of inductive coupling of an AC voltage.

Using an externally applied, temporally variable magnetic field, an AC voltage is advantageously induced in the electrical conductor path and/or in the further electrical conductor path. By an antiparallel connection of the first and second segments of the semiconductor body, the segment that is connected in the forward direction during the respective phase of the induced voltage emits light in each case. The segments thus emit light alternately. Where a converter material is arranged on the segments, it is advantageously possible that, with an appropriate frequency of the AC voltage, an afterglow of the converter material takes place and a possible scattering of the radiation emitted by the segments is visible through the matrix material or the converter material. An impression of alternating light emission by the segments is therefore reduced for an observer, particularly if the operating frequency of the alternately light-emitting regions is higher than the reaction time of the observer. A matrix material can advantageously be selected which has good waveguide characteristics for the radiation emitted by the segment and/or by the converter material in order to achieve homogeneous illumination of the emission side of the component even during the alternating emission by the segments. The matrix material with the converter material can advantageously extend as a continuous part on both segments and over a separation trench of the segments.

BRIEF DESCRIPTION OF THE DRAWINGS

FIGS. 6a and 6b show schematic views of planes of the carrier.

DETAILED DESCRIPTION OF ILLUSTRATIVE EMBODIMENTS

An optoelectronic component as described here and a method for manufacturing and operating an optoelectronic component are explained in more detail below with reference to the figures with the aid of exemplary embodiments. Identical elements or elements having the same effect are in each case provided with the same reference signs in the figures. The components illustrated in the figures and the size ratios to one another of the components should not be considered as being to scale.

Figure 1:
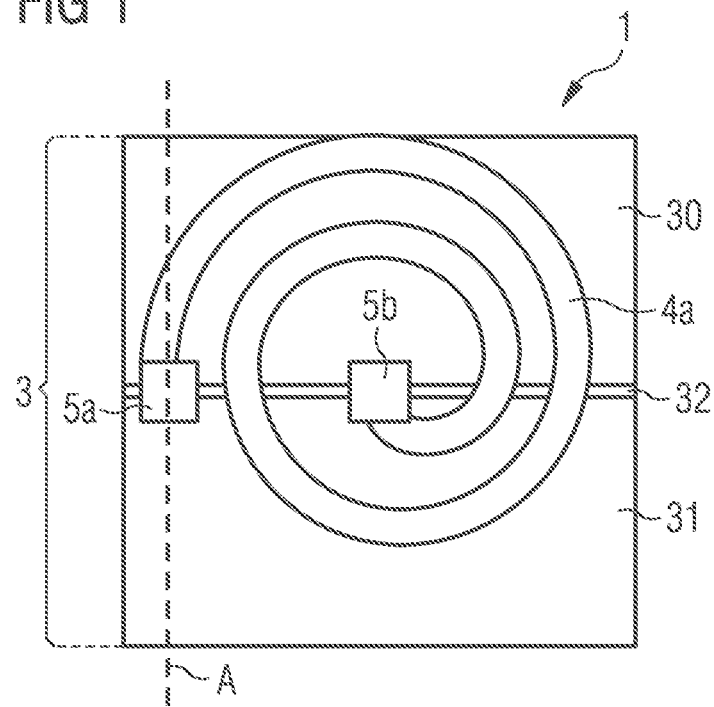
FIGS. 1 and 4 show an optoelectronic component in a top view of a side of the semiconductor body facing towards the carrier.

FIG. 1 shows a top view of the first segment 30 and the second segment 31 of the semiconductor body 3 on a side facing towards the carrier and advantageously a side facing away from the emission side. The first segment 30 and the second segment 31 are separated from one another by a separation trench 32. A first electrical connecting structure 5a and a second electrical connecting structure 5b are arranged on the semiconductor body such that they each span the separation trench 32 and are each arranged partly on the first segment 30 and partly on the second segment 31. It is thereby possible that, for example, the first connecting structure 5a connects a p-type semiconductor layer of the first segment to an n-type semiconductor layer of the second segment and the second connecting structure 5b connects an n-type semiconductor layer of the first segment to a p-type semiconductor layer of the second segment, and thus the segments are connected in antiparallel. Furthermore, FIG. 1 shows an electrical conductor path 4a, which is arranged on the first segment 30 and on the second segment 31, spans the separation trench 32 and connects the first connecting structure 5a to the second connecting structure 5b. The electrical conductor path 4a has at least one turn and acts as a coil for the inductive coupling of alternating current into the component 1. The coil here is connected in parallel with the first segment 30 and the second segment 31.

Figure 2:
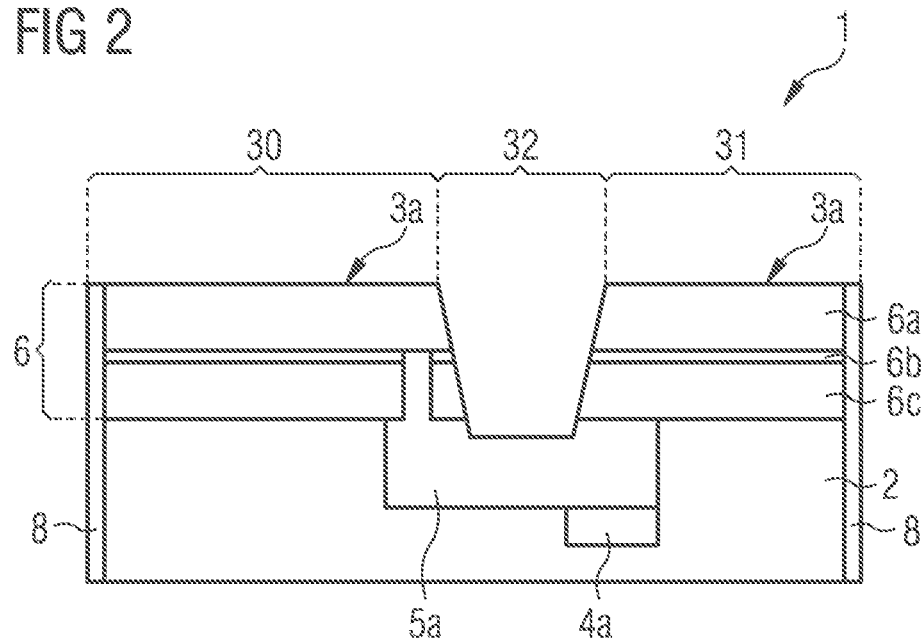
FIG. 2 shows a schematic section through the optoelectronic component in a side view.

FIG. 2 shows a cross-section through the optoelectronic component 1 along a line A from FIG. 1. The first segment 30 and the second segment 31 each comprise a semiconductor layer stack 6, which comprises an n-type semiconductor layer 6a, a p-type semiconductor layer 6c and an active zone 6b. The first electrical connecting structure 5a connects the n-type semiconductor layer 6a of the first segment 30 to the p-type semiconductor layer 6c of the second segment. This is achieved by means of the fact that the first electrical connecting structure 5a in the first segment 30 advantageously penetrates through the active zone 6b located below the n-type semiconductor layer 6a and through the p-type semiconductor layer 6c by means of a via hole which is insulated at the edges. Alternatively, it is possible to guide a contact to the n-type semiconductor layer 6a on the outside of the segment 30 without a via hole. Alternatively, is also possible to guide a contact of the first electrical connecting structure 5a on the inside of the separation trench 32. The insides of the separation trench 32 advantageously comprise an electrical insulation. The contacting of the semiconductor layers 6a and 6b of the segments 30 and 31 could also be carried out by the first electrical connecting structure 5a in the reverse direction.

The arrangement of the n-type and p-type semiconductor layers is interchangeable.

Furthermore, the first electrical connecting structure 5a is contacted, e.g., on the bottom side facing away from the semiconductor body 3 to an electrical conductor path 4a. A molded body forms a carrier 2 as a potting, in which the first electrical connecting structure 5a and the electrical conductor path 4a are embedded and are bridged by the molded body.

The segments 30 and 31 each comprise an emission side 3a, which faces away from the carrier 2.

Furthermore, FIG. 2 shows a transparent protective lacquer 8, which is deposited on external surfaces of the component 1.

Figure 3:
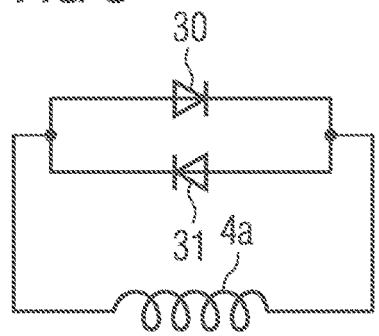
FIGS. 3 and 5 show an electrical circuit diagram of the optoelectronic component.

FIG. 3 shows an electrical circuit diagram of a semiconductor body of the optoelectronic component with the electrical conductor path 4a. The first segment 30 and the second segment 31 act as diodes, which are connected in antiparallel. The electrical conductor path 4a acts as a coil, which is connected in parallel with the diodes of the first segment 30 and of the second segment 31. If an alternating current is coupled through the coil 4a, depending on the direction of flow of the current, in other words depending on the phase of the current, one diode is connected in the forward direction and emits light and the other diode is connected in the reverse direction and emits no light. When the phases are reversed, the roles of the diodes are reversed.

Figure 4:
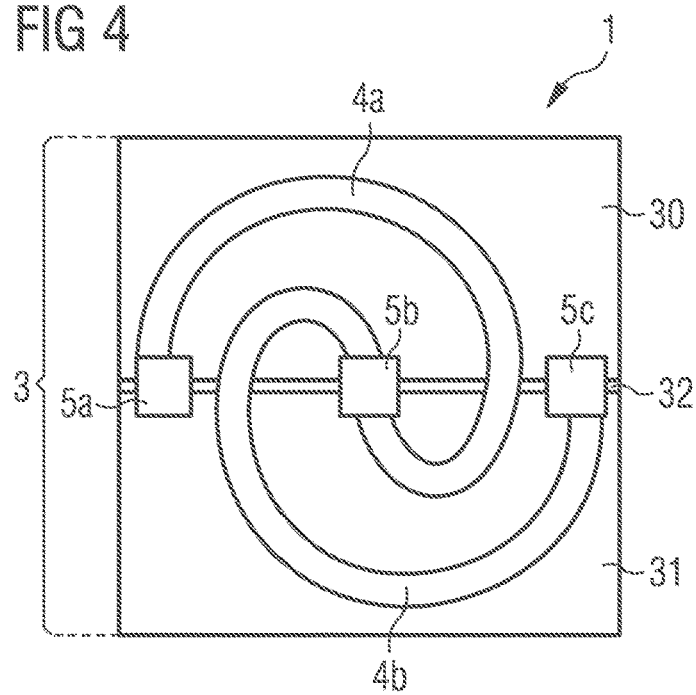

FIG. 4 shows a top view of the first segment 30 and the second segment 31 of the semiconductor body 3 on a side facing towards the carrier according to FIG. 1. In contrast to the exemplary embodiment from FIG. 1, the component 1 in FIG. 4 comprises a third electrical connecting structure 5c. The third electrical connecting structure 5c is advantageously formed identically to the first connecting structure 5a and connects the same semiconductor layers to one another as the first connecting structure 5a. Furthermore, a further electrical conductor path 4b is arranged between the second connecting structure 5b and the third connecting structure 5c on the first segment 30 and on the second segment 31. The further electrical conductor path 4b between the second connecting structure 5b and the third connecting structure 5c advantageously has at least one turn and is in the shape of a coil, which is connected in parallel with the first segment 30 and the second segment 31 by way of the second connecting structure 5b and the third connecting structure 5c.

Figure 5:
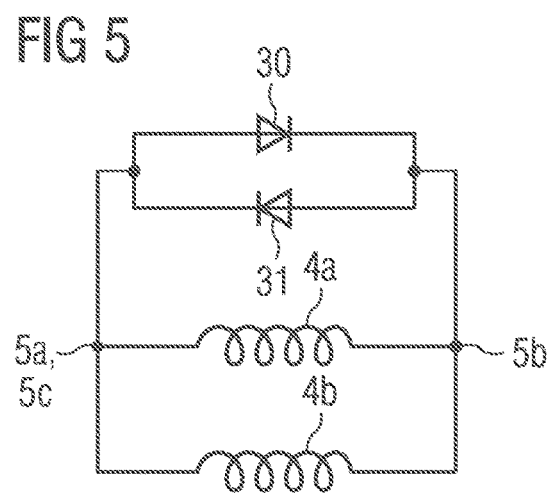

FIG. 5 shows an electrical circuit diagram of a semiconductor body of the optoelectronic component with the electrical conductor path 4a according to FIG. 3 with the addition that a further electrical conductor path 4b is connected in parallel with the segments 30 and 31. The first electrical connecting structure 5a and the third electrical connecting structure 5c are each in contact with the same semiconductor layers and therefore act as the same switching point in the circuit diagram. The further electrical conductor path 4b between the second connecting structure 5b and the third connecting structure 5c advantageously acts as a second coil 4b and acts as a further voltage source during inductive current coupling.

FIG. 6a shows a top view of a first plane 2a of the molded body, said plane comprising the electrical conductor path 4a. The electrical conductor path 4a is connected to the first electrical connecting structure 5a and comprises a first turn, which covers the largest possible region of the first segment 30 and of the second segment 31 of the semiconductor body 3 on a side facing away from the emission side and spans the separation trench 32. A first electrical connecting structure 5a and a second electrical connecting structure 5b are arranged on the semiconductor body such that they each span the separation trench 32 and are each arranged partly on the first segment 30 and partly on the second segment 31, the first electrical connecting structure 5a and the second electrical connecting structure 5b being spaced apart from one another laterally along the separation trench 32. The first electrical connecting structure 5a is advantageously in direct electrical contact with the electrical conductor path 4a. This can be achieved, e.g., with a contact via, which runs at least partly through the first plane 2a. At a contact point D, advantageously by way of a via hole, the first turn of the electrical conductor path 4a can be connected to a second turn or multiple turns of the electrical conductor path 4a in a second plane located there below, as illustrated, e.g., in FIG. 6b.

FIG. 6b, similarly to FIG. 6a, shows a second plane 2b which is located below the first plane from FIG. 6a and which comprises a second turn of the electrical conductor path 4a. The second turn is connected in a contact point D to the first turn in the first plane located there above, advantageously being connected in series. The first and the second turn advantageously run in the same direction around the segments 30 and 31. The second turn overlaps the first turn in a top view apart from the region in which the electrical conductor path 4a is guided to the second electrical connecting structure 5b, which extends into the second plane 2b.

Through the first and the second plane of the molded body, the turns of the electrical conductor path 4a are advantageously spaced apart from one another. The electrical conductor path 4a can also have more than one turn or a turn of less than 360° in one of the two planes. Alternatively, it is also possible that the turns in the first and second planes do not overlap.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. An optoelectronic component comprising:
 a carrier comprising a molded body;
 a light-emitting semiconductor body with a first segment and a second segment, wherein the first segment and the second segment are spatially separated from one another, and wherein each segment has an emission side facing away from the carrier;
 a first electrical conductor path arranged on the first segment and on the second segment on a side of the light-emitting semiconductor body facing towards the carrier; and
 a first electrical connecting structure, a second electrical connecting structure and a third electrical connecting structure, each electrically connecting the first segment and the second segment to one another, wherein the first and second electrical connecting structures are electrically connected to one another by the first electrical conductor path such that the first segment and the second segment are connected antiparallel by the first electrical connecting structure and the second electrical connecting structure, wherein the third electrical connecting structure is electrically connected to the second electrical connecting structure by a second electrical conductor path, and wherein the first electrical connecting structure, the second electrical connecting structure and the first electrical conductor path are completely covered by the molded body on a side of the light-emitting semiconductor body facing towards the carrier.

2. The optoelectronic component according to claim 1, wherein the first segment and the second segment are identically structured.

3. The optoelectronic component according to claim 1, wherein the first segment and the second segment do not overlap in a top view.

4. The optoelectronic component according to claim 1, wherein the first electrical conductor path comprises a coil with at least one turn between the first electrical connecting structure and the second electrical connecting structure.

5. The optoelectronic component according to claim 1, wherein the second electrical conductor path is a coil with at least one turn between the second electrical connecting structure and the third electrical connecting structure.

6. The optoelectronic component according to claim 1, wherein the third electrical connecting structure and the second electrical conductor path between the second electrical connecting structure and the third electrical connecting structure are completely covered by the molded body on the side of the light-emitting semiconductor body facing towards the carrier.

7. The optoelectronic component according to claim 1, wherein the first electrical connecting structure and the second electrical connecting structure as well as the second electrical connecting structure and the third electrical connecting structure connect the first segment and the second segment antiparallel in each case.

8. The optoelectronic component according to claim 1, wherein the second electrical conductor path between the second electrical connecting structure and the third electrical connecting structure is connected in parallel with the first segment and with the second segment.

9. The optoelectronic component according to claim 1, wherein the first electrical conductor path between the first electrical connecting structure and the second electrical connecting structure is connected in parallel with the first segment and with the second segment.

10. The optoelectronic component according to claim 1, wherein the molded body comprises an electrically insulating plastic material.

11. The optoelectronic component according to claim 1, wherein the molded body comprises a first plane and a second plane, and wherein the first plane comprises a first turn of the first electrical conductor path and the second plane comprises a second turn of the first electrical conductor path.

12. The optoelectronic component according to claim 11, wherein, in a top view, the first turn of the first electrical conductor path in the first plane at least partly overlaps with the second turn of the first electrical conductor path in the second plane.

13. The optoelectronic component according to claim 1, wherein the light-emitting semiconductor body is configured to operate with an AC voltage.

14. The optoelectronic component according to claim 1, further comprising a converter material arranged on the emission side of the first segment and/or of the second segment.

15. A method comprising:
manufacturing an optoelectronic component that comprises a carrier comprising a molded body, a light-emitting semiconductor body with a first segment and a second segment, a first electrical conductor path arranged on the first segment and on the second segment on a side of the light-emitting semiconductor body facing towards the carrier, a first electrical connecting structure connecting the first segment and the second segment to one another and a second electrical connecting structure connecting the first segment and the second segment to one another,
wherein the first segment and the second segment are spatially separated from one another,
wherein each segment has an emission side facing away from the carrier,
wherein the first and second electrical connecting structures are electrically connected to one another by the first electrical conductor path such that the first segment and the second segment are connected antiparallel by the first electrical connecting structure and the second electrical connecting structure,
wherein the first electrical connecting structure, the second electrical connecting structure and the first electrical conductor path are completely covered by the molded body on a side of the light-emitting semiconductor body facing towards the carrier,
wherein the optoelectronic component is manufactured in a wafer composite,
wherein the first electrical conductor path is produced by electroplating on the light-emitting semiconductor body, and
wherein the carrier is manufactured by encapsulating the light-emitting semiconductor body, the electrical connecting structures and the first electrical conductor path with the molded body such that on the side of the light-emitting semiconductor body facing towards the carrier, the electrical connecting structures and the first electrical conductor path are completely covered by the molded body.

16. The method according to claim 15, wherein a converter material is deposited on the emission side.

17. The method according to claim 15, wherein a transparent protective lacquer is deposited on all external surfaces of the optoelectronic component.

18. A method comprising:
providing an optoelectronic component that includes a light-emitting semiconductor body;
operating the light-emitting semiconductor body by inductive coupling of an AC voltage;
wherein the optoelectronic component comprises:
a carrier comprising a molded body;
the light-emitting semiconductor body, wherein the light-emitting semiconductor body has a first segment and a second segment that are spatially separated from one another, and wherein each segment has an emission side facing away from the carrier;
a first electrical conductor path arranged on the first segment and on the second segment on a side of the light-emitting semiconductor body facing towards the carrier; and
a first electrical connecting structure, a second electrical connecting structure and a third electrical connecting structure, each electrically connecting the first segment and the second segment to one another, wherein the first and second electrical connecting structures are electrically connected to one another by the first electrical conductor path such that the first segment and the second segment are connected antiparallel by the first electrical connecting structure and the second electrical connecting structure, wherein the third electrical connecting structure is electrically connected to the second electrical connecting structure by a second electrical conductor path, and wherein the first electrical connecting structure, the second electrical connecting structure and the first electrical conductor path are completely covered by the molded body on a side of the light-emitting semiconductor body facing towards the carrier.

19. The method according to claim 18, wherein the first electrical conductor path comprises a coil with at least one turn between the first electrical connecting structure and the second electrical connecting structure.

20. The method according to claim 19, wherein the second electrical conductor path comprises a coil with at least one turn between the second electrical connecting structure and the third electrical connecting structure.

* * * * *